(12) United States Patent
Wu et al.

(10) Patent No.: US 12,106,995 B2
(45) Date of Patent: Oct. 1, 2024

(54) STRUCTURE AND METHOD FOR TRANSFERRING A MICRO SEMICONDUCTOR ELEMENT BY APPLYING A SEPARATION FORCE VIA A THROUGH HOLE

(71) Applicant: XIAMEN SANAN OPTOELECTRONICS TECHNOLOGY CO., LTD., Xiamen (CN)

(72) Inventors: Zheng Wu, Xiamen (CN); Shao-Ying Ting, Xiamen (CN); Chia-En Lee, Xiamen (CN); Chen-Ke Hsu, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 412 days.

(21) Appl. No.: 16/830,938

(22) Filed: Mar. 26, 2020

(65) Prior Publication Data
US 2020/0227302 A1 Jul. 16, 2020

Related U.S. Application Data

(63) Continuation-in-part of application No. PCT/CN2018/085127, filed on Apr. 28, 2018.

(30) Foreign Application Priority Data

Sep. 30, 2017 (CN) .......................... 201710918727.1

(51) Int. Cl.
*H01L 21/683* (2006.01)
*H01L 23/00* (2006.01)
*H01L 33/00* (2010.01)

(52) U.S. Cl.
CPC .......... *H01L 21/6835* (2013.01); *H01L 24/29* (2013.01); *H01L 24/83* (2013.01);
(Continued)

(58) Field of Classification Search
CPC ........... H01L 21/6835; H01L 21/67011; H01L 33/0093; H01L 2221/68363;
(Continued)

(56) References Cited

U.S. PATENT DOCUMENTS 7,888,690 B2 * 2/2011 Iwafuchi ............. H01L 33/0093
257/89
8,132,608 B2 * 3/2012 Chen ..................... B65H 37/04
156/550

(Continued)

FOREIGN PATENT DOCUMENTS

CN 106229287 A 12/2016
CN 106328576 A 1/2017
(Continued)

OTHER PUBLICATIONS

Search Report issued to PCT application No. PCT/CN2018/085127 by the CNIPA on Aug. 2, 2018.

*Primary Examiner* — Khiem D Nguyen
(74) *Attorney, Agent, or Firm* — Muncy, Geissler, Olds & Lowe, P.C.

(57) ABSTRACT

A method for transferring a micro semiconductor element includes the following steps. A substrate, a bonding layer disposed on the substrate, and a supporting member disposed on the bonding layer opposite to the substrate are provided. The supporting member is bonded to a micro semiconductor element for supporting the same. A through hole is provided to extend through the substrate, the bonding layer, and the supporting member so as to forma transfer structure. A separation force is applied via the through hole (Continued)

to separate the micro semiconductor element from the supporting member.

11 Claims, 5 Drawing Sheets

(52) U.S. Cl.
  CPC .............................. *H01L 33/0093* (2020.05); *H01L 2221/68363* (2013.01); *H01L 2221/68381* (2013.01); *H01L 2224/2919* (2013.01); *H01L 2224/83005* (2013.01)

(58) Field of Classification Search
  CPC . H01L 2221/68381; H01L 2224/83005; H01L 2224/68354; H01L 24/29; H01L 24/83; H01L 2224/2919; H01L 2224/68363; H01L 2224/16881; H01L 2224/68881; H01L 2224/68381; H01L 2221/68354
  USPC ......................................................... 156/247
  See application file for complete search history.

(56) References Cited

U.S. PATENT DOCUMENTS

| | | | |
|---|---|---|---|
| 8,835,940 B2 * | 9/2014 | Hu | H01L 24/83 257/79 |
| 9,368,683 B1 * | 6/2016 | Meitl | H01L 33/62 |
| 9,899,329 B2 * | 2/2018 | Bower | H01L 23/5389 |
| 10,170,352 B2 * | 1/2019 | Itonaga | H01L 21/6836 |
| 2009/0229749 A1 * | 9/2009 | Teel | B65H 37/002 156/310 |
| 2010/0171215 A1 * | 7/2010 | Fischer | H01L 24/95 257/734 |
| 2010/0230711 A1 * | 9/2010 | Kuo | H01L 33/0093 257/E33.056 |
| 2014/0273190 A1 * | 9/2014 | Peng | B01L 3/50273 422/505 |
| 2014/0340900 A1 * | 11/2014 | Bathurst | H01L 24/00 362/249.02 |
| 2014/0355251 A1 * | 12/2014 | Kahrs | H01L 33/58 438/27 |
| 2015/0005717 A1 * | 1/2015 | Chappel | F16K 99/0057 604/247 |
| 2015/0349223 A1 * | 12/2015 | Lee | H01L 33/62 257/99 |
| 2016/0049546 A1 * | 2/2016 | Hwang | H01L 33/385 257/13 |
| 2016/0167358 A1 * | 6/2016 | Tang | B05D 1/32 156/247 |
| 2017/0236807 A1 * | 8/2017 | Hwang | H01L 33/0075 257/90 |
| 2017/0345867 A1 * | 11/2017 | Chaji | H01L 25/0753 |
| 2018/0122664 A1 * | 5/2018 | Hsu | B65G 61/00 |
| 2018/0240767 A1 * | 8/2018 | Liu | H01L 27/1214 |

FOREIGN PATENT DOCUMENTS

| | | |
|---|---|---|
| CN | 106449498 A | 2/2017 |
| CN | 107039298 A | 8/2017 |
| CN | 107068693 A | 8/2017 |
| CN | 107818931 A | 3/2018 |

* cited by examiner

STRUCTURE AND METHOD FOR TRANSFERRING A MICRO SEMICONDUCTOR ELEMENT BY APPLYING A SEPARATION FORCE VIA A THROUGH HOLE

CROSS-REFERENCE TO RELATED APPLICATION

This application is a bypass continuation-in-part application of International Application No. PCT/CN2018/085127 filed on Apr. 28, 2018, which claims priority of Chinese Patent Application No. 201710918727.1, filed on Sep. 30, 2017. The entire content of each of the international and Chinese patent applications is incorporated herein by reference.

FIELD

The disclosure relates to a structure and a method for transferring a semiconductor element, and more particularly to a structure and a method for transferring a micro semiconductor element.

BACKGROUND

Technology involving micro semiconductor elements is particularly directed to an array of semiconductor elements having a microsize and distributed at a high density. Among these micro semiconductor elements, micro light-emitting elements (such as micro light-emitting diodes) are being the focus of research and development. Therefore, products related to micro light-emitting elements seem promising in the industry. It is expected that display devices composed of micro light-emitting elements, which have high resolution, will replace display devices composed of conventional light-emitting elements having a larger size.

During production of micro semiconductor elements, normally such elements are placed on a transfer substrate, and are subsequently transferred to a receiver substrate (e.g. a substrate for a display device) from the transfer substrate. The difficulty of the aforesaid production resides in that a large number of micro semiconductor elements must be transferred to the receiver substrate at a satisfactorily high rate of success.

Ideally, in transferring micro semiconductor elements, a successful transfer rate of 100% is required. However, since micro semiconductor elements (having, for instance, a size of less than 100 µm) are still slightly different and hence need different adhesion forces upon transfer, a conventional transfer means (such as a transfer tape) which normally provides uniform adhesion forces leads to a successful transfer rate of less than 100%. Therefore, there is a need to develop a satisfactory means and a satisfactory method for transferring micro semiconductor elements.

SUMMARY

Therefore, an object of the disclosure is to provide a method and a structure for transferring a micro semiconductor element, which can alleviate at least one of the drawbacks of the prior art.

The method of this disclosure includes the following steps. A substrate, a bonding layer disposed on the substrate, and a supporting member disposed on the bonding layer opposite to the substrate are provided. The supporting member is bonded to a micro semiconductor element, so that the supporting member supports the micro semiconductor element. A through hole is provided to extend through the substrate, the bonding layer, and the supporting member. A separation force is applied via the through hole to separate the micro semiconductor element from the supporting member.

The structure of this disclosure includes a substrate, a bonding layer disposed on the substrate, and a supporting member disposed on the bonding layer opposite to the substrate and configured to be bonded to a micro semiconductor element for supporting the micro semiconductor element. A through hole extends through the substrate, the bonding layer, and the supporting member.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
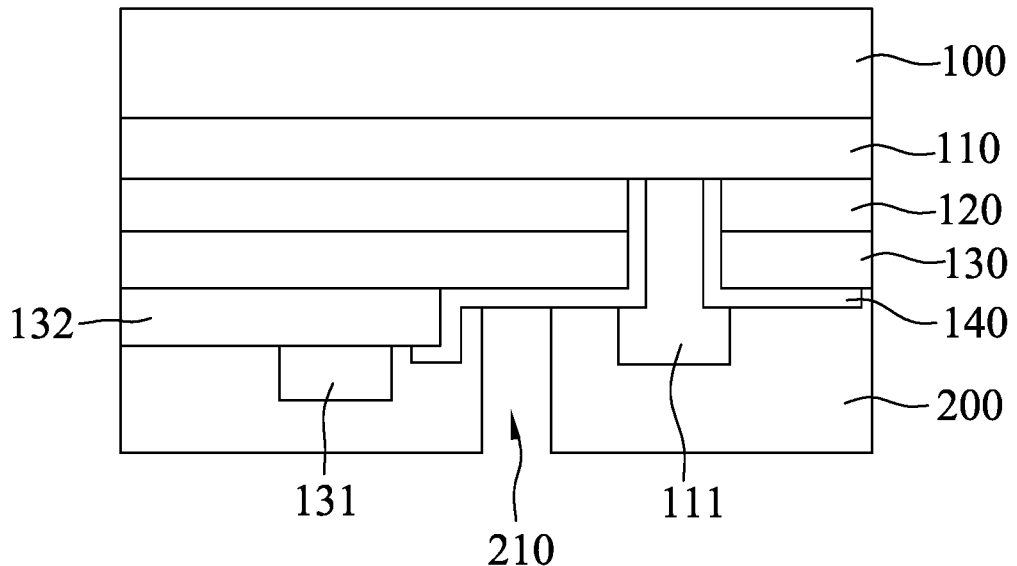
FIG. 1 is a schematic sectional view illustrating a micro light-emitting element that is to be transferred using a first embodiment of a transfer method according to the present disclosure, as well as step 2 of the first embodiment of the transfer method.

Before the disclosure is described in greater detail, it should be noted that where considered appropriate, reference numerals or terminal portions of reference numerals have been repeated among the figures to indicate corresponding or analogous elements, which may optionally have similar characteristics.

The present disclosure provides a method for transferring a micro semiconductor element. Exemplary micro semiconductor elements include, but are not limited to, micro light-emitting elements such as micro light-emitting diodes (micro LEDs), micro semiconductor laser diodes, micro photodiodes, micro transistors, micro solid-state image sensing devices, micro light emitters and receivers for photocouplers, microprocessor units, micro integrated circuits, and micro thyristors.

A first embodiment of the method is for transferring a micro light-emitting element, and includes steps 1 to 7.

In step 1, a micro light-emitting element is provided, and includes a growth substrate 100, a first-type semiconductor layer 110 that is disposed on the growth substrate 100, an active layer 120 that is disposed on the first-type semiconductor layer 110 opposite to the growth substrate 100, a second-type semiconductor layer 130 that is disposed on the active layer 120 opposite to the first-type semiconductor layer 110, a current spreading layer 132 that is disposed on the second-type semiconductor layer 130 opposite to the active layer 120, a first electrode 111 that is electrically connected with the first-type semiconductor layer 110, and a second electrode 131 that is disposed on the current spreading layer 132 and that is electrically connected with the second-type semiconductor layer 130 (see FIG. 1 for these components of the micro light-emitting element).

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be an n-type dopant, and the second conductivity type dopant may be a p-type dopant, and vice versa.

Optionally, the micro light-emitting element further includes an insulation layer 140 that is disposed on the second-type semiconductor layer 130, the active layer 120, and the current spreading layer 132 opposite to the growth substrate 100. The insulation layer 140 has an upper section that is disposed on a surface of the second-type semiconductor layer 130 facing away from the active layer 120, and that cooperates with the second electrode 131, the current spreading layer 132, and an upper portion of the first electrode 111 disposed upwardly of the second-type semiconductor layer 130 to constitute a top part of the micro light-emitting element. The top part of the micro light-emitting element is opposite to the growth substrate 100 of the micro light-emitting element (i.e. a bottom part of the micro light-emitting element). The insulation layer 140 can protect the micro light-emitting element against short circuit, physical damage, and so forth. In addition, the insulation layer 140, which serves to be connected to the transfer structure of the present disclosure, is able to prevent the electrodes on the micro light-emitting element from being undesirably removed, since separation of the insulation layer 140 from the transfer structure of the present disclosure is convenient and can steer clear of the electrodes.

In step 2, referring to FIG. 1, a sacrificial layer 200 is formed over the top part of the micro light-emitting element. The sacrificial layer 200 has a penetration hole 210 that extends therethrough to partially expose the upper section of the insulation layer 140, and may be made from a material selected from the group consisting of TiW, Al, Ni, and combinations thereof.

Figure 2:
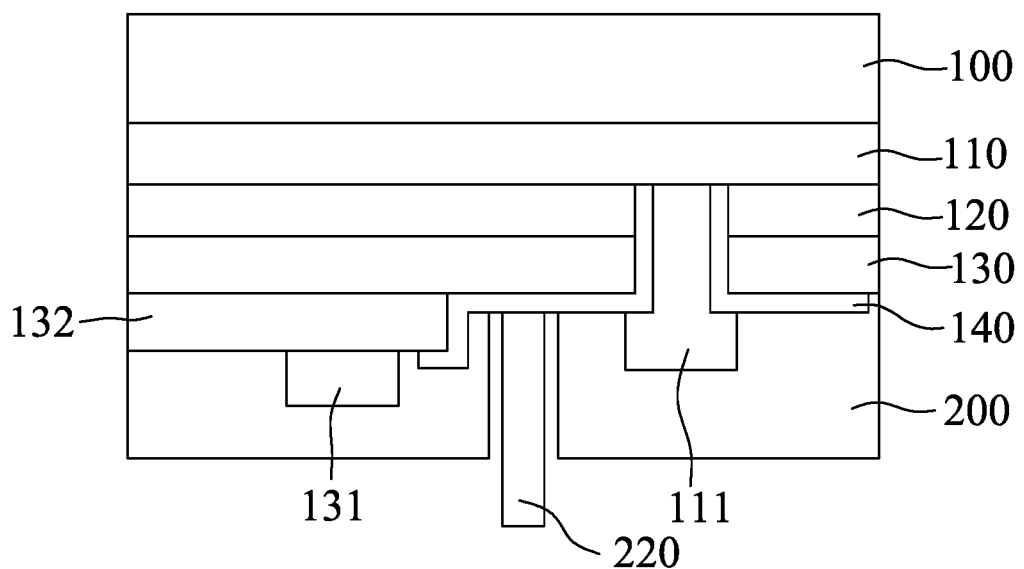
FIG. 2 is a schematic sectional view illustrating step 3 of the first embodiment of the transfer method.

In step 3, referring to FIG. 2, a hole-forming pillar 220 is formed in the penetration hole 210. The hole-forming pillar 220 is made from silicon dioxide, and has a width ranging from 1 µm to 10 µm.

Figure 3:
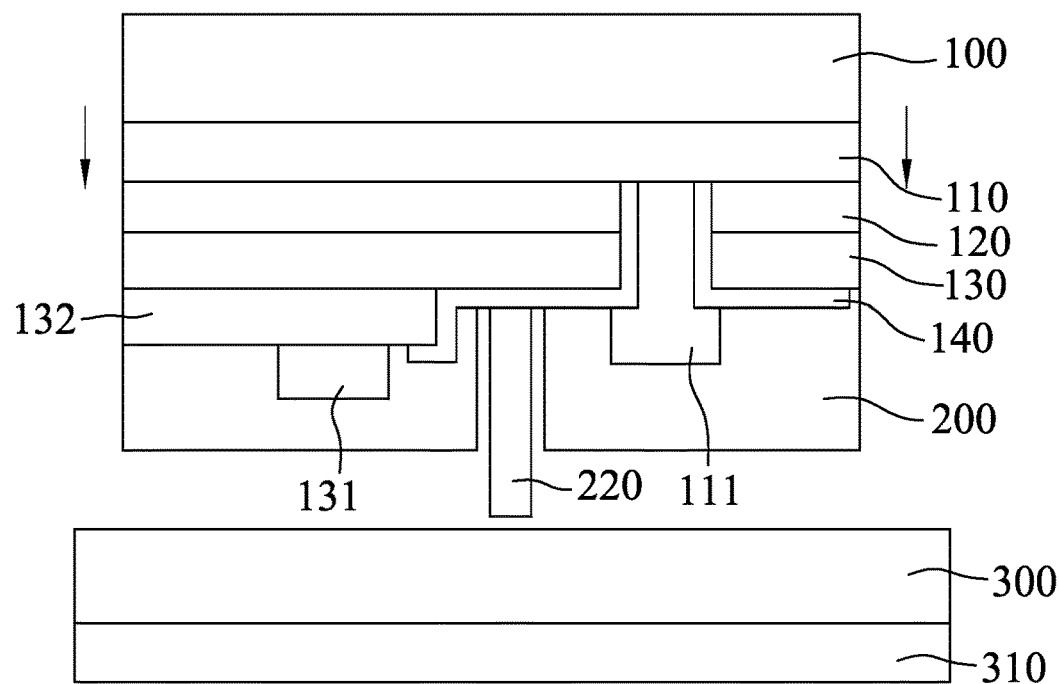
FIGS. 3 and 4 are schematic sectional views illustrating step 4 of the first embodiment of the transfer method.
Figure 4:
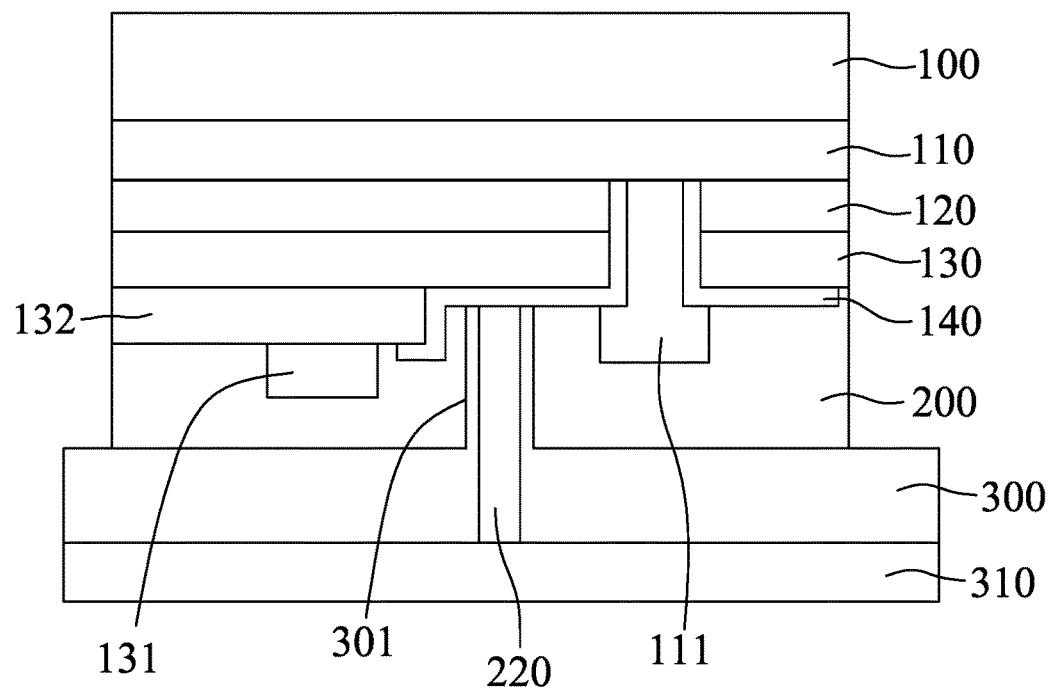

In step 4, referring to FIG. 3, a substrate 310 and a bonding layer 300 disposed on the substrate 310 are provided. Further, as shown in FIG. 4, the bonding layer 300 and the sacrificial layer 200 are subjected to a bonding process, such that: the bonding layer 300 and the sacrificial layer 200 are bonded to each other; a supporting member 301 is formed on the bonding layer 300 opposite to the substrate 310 for supporting the micro light-emitting element, and is formed over and encapsulates the hole-forming pillar 220; the hole-forming pillar 220 extends through the bonding layer 300 to be connected to the substrate 310; and the supporting member 301 is bonded to the upper section of the insulation layer 140. Specifically, during the bonding process conducted at a high temperature and a high pressure, a portion of the bonding layer 300 in a fluid state enters the penetration hole 210 to cover the hole-forming pillar 220 and to hence form the supporting member 301, and the hole-forming pillar 220 extends through the bonding layer 300 in such fluid state to be connected to the substrate 310. Accordingly, in this embodiment, the bonding layer 300 and the supporting member 301 are made from the same material. Nevertheless, in other embodiments, the bonding layer 300 and the supporting member 301 may be made from different materials (i.e. the supporting member 301 may be formed on the bonding layer 300 using a process different from the bonding process).

The bonding layer 300 and the supporting member 301 may be made from a material selected from the group consisting of a benzocyclobutene (BCB)-based polymer, silicone rubber, a polyester resin, polyurethane, polyimide, artificial rubber other than silicone rubber, an epoxy resin, polydimethylsiloxane, polyethylene terephthalate, poly (methyl methacrylate), multiwalled carbon nanotubes, and combinations thereof. Nevertheless, the bonding layer 300 and the supporting member 301 may be made from a polymer material other than those described above.

Figure 5:
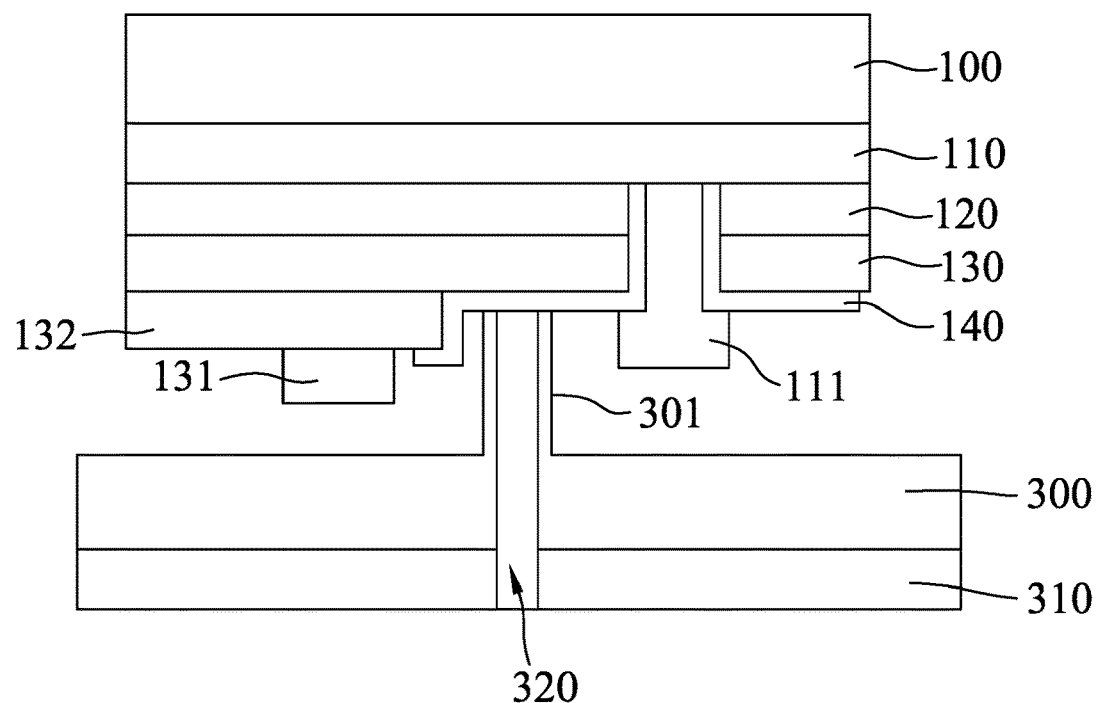
FIG. 5 is a schematic sectional view illustrating step 5 of the first embodiment of the transfer method, as well as a first embodiment of a transfer structure according to the present disclosure.

In step 5, referring to FIG. 5, the sacrificial layer 200 is removed through wet etching. Further, laser is applied to penetrate the substrate 310 and remove the hole-forming pillar 220 using an optical positioning system, such that a through hole 320 is formed to extend through the substrate 310, the bonding layer 300, and the supporting member 301. The through hole 320 partially exposes the upper section of the insulation layer 140.

The substrate 310, the bonding layer 300, and the supporting member 301 obtained after step 5 together constitute a first embodiment of a structure for transferring a micro semiconductor element.

The through hole 320 may have a width ranging from 1 µm to 10 µm.

Figure 6:
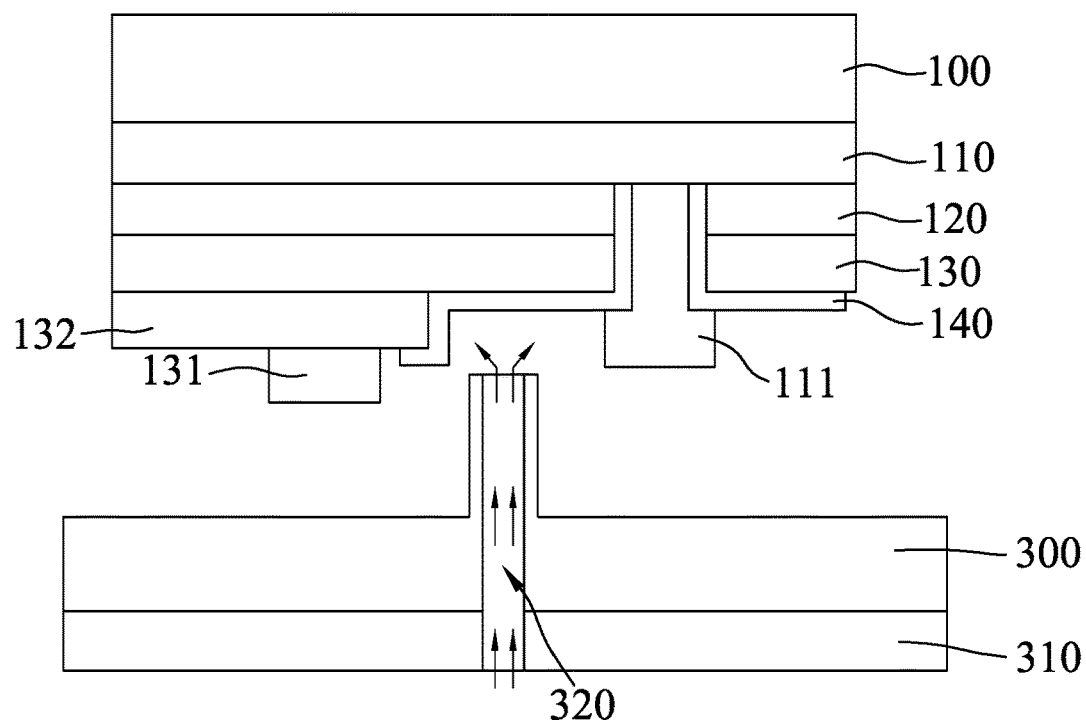
FIG. 6 is a schematic sectional view illustrating step 6 of the first embodiment of the transfer method.

In step 6, referring to FIG. 6, a pushing force is applied via the through hole 320 to separate the micro light-emitting element from the supporting member 301. The pushing force may be generated by injecting a fluid. Examples of the fluid include, but are not limited to, gases (for instance, inert gases) and liquids. The flow rate of an applicable gas (or an applicable fluid) may range from 5 g/mm$^2$ to 15 g/mm$^2$.

In step 7, the separated micro light-emitting element shown in FIG. 6 is transferred using a common transfer means such as a suction device.

A second embodiment of the transfer method and the transfer structure is generally similar to the first embodiment of the transfer method and the transfer structure, except for the following difference.

A plurality of the supporting members 301 are formed on the bonding layer 300 opposite to the substrate 310, and are respectively bonded to a plurality of the micro light-emitting elements. A plurality of the through holes 320 are formed to extend through the substrate 310 and the bonding layer 300, and to respectively extend through the supporting members 301.

Figure 7:
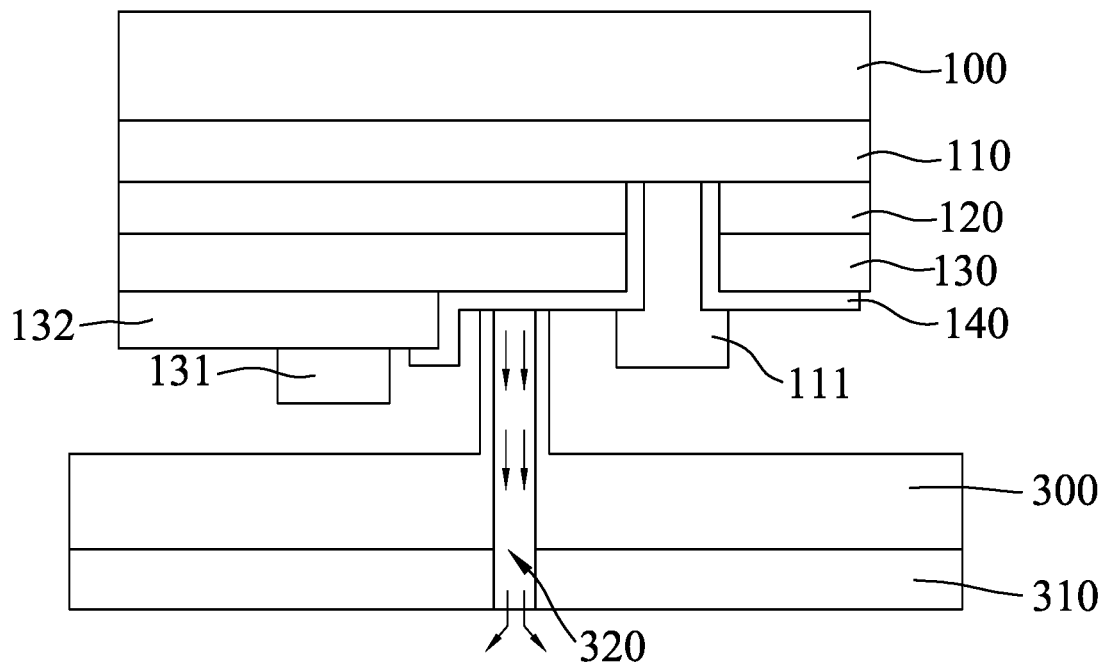
FIG. 7 is a schematic sectional view illustrating step 6 of a second embodiment of the transfer method according to the present disclosure.

In step 6, the pushing force may be applied to all or only selected one(s) of the micro light-emitting elements, so as to entirely or selectively separate the micro light-emitting elements from the corresponding supporting members 301. When only selected one(s) of the micro light-emitting elements is/are to be separated by the pushing force via the corresponding through hole (s) 320, as shown in FIG. 7, a vacuum suction force may simultaneously be applied to remaining one (s) of the micro light-emitting elements through the corresponding through hole(s) 320 (please note that only one remaining micro light-emitting element is shown in FIG. 7), so as to prevent such remaining one (s) of the micro light-emitting elements from being undesirably separated due to vibration or other undesired phenomenon arising from the pushing force.

A third embodiment of the transfer method and the transfer structure is generally similar to the second embodiment of the transfer method and the transfer structure, except for the following difference.

The substrate 310 may have a thickness ranging from 50 µm to 100 µm, and may be made from a material selected from sapphire, Si, and a metal.

Before the bonding process is conducted, the plurality of the supporting members 301 are already formed on the bonding layer 300 opposite to the substrate 310 (namely, in the third embodiment, the bonding process as applied in the first embodiment is not required to form the plurality of the supporting members 301). Furthermore, before the bonding process is conducted, the plurality of the through holes 320 are already formed to extend through the substrate 310 and the bonding layer 300, and to respectively extend through the supporting members 301 (namely, in the third embodiment, the application of laser as mentioned in the first embodiment is not required to form the through holes 320 and is hence dispensed with). Since the supporting members 301 and the through holes 320 are already formed before the bonding process, the formation and removal of the sacrificial layer 200 as mentioned in the first embodiment are not required and hence are dispensed with in this embodiment.

When the bonding process is to be conducted, a common transfer means (e.g. a suction device) is first used to transfer the plurality of the micro light-emitting elements so as to respectively place the same on the supporting members 301. Subsequently, the bonding process is conducted, such that the supporting members 301 are respectively bonded to the micro light-emitting elements.

In the third embodiment, only selected one (s) of the micro light-emitting elements is/are separated by the pushing force via the corresponding through hole(s) 320, and a vacuum suction force is simultaneously applied to remaining one(s) of the micro light-emitting elements via the corresponding through hole(s) 320 so as to prevent such remaining one(s) of the micro light-emitting elements from being separated. The remaining one(s) of the micro light-emitting elements retained on the supporting member(s) 301 of the transfer structure is/are to be transferred to a target substrate. Specifically, another pushing force is applied by, for instance, injecting a gas, to separate the remaining one(s) of the micro light-emitting elements from the supporting member(s) 301 via the corresponding through hole (s) 320, and the bottom part (i.e. the growth substrate 100) of each of the separated one(s) of the micro light-emitting elements is attached to the target substrate (namely, such micro semiconductor element(s) are flipped over to have the top part thereof facing away from the target substrate).

Even though the micro light-emitting element(s) can be conveniently separated from the supporting member(s) 301 in a tubular shape as shown in FIG. 6, in order to more securely ensure complete separation of the supporting member(s) 301 from the micro light-emitting element(s) (i.e. no presence of residue of the supporting member(s) on the insulation layer 140), a fourth embodiment of the transfer structure is provided. The fourth embodiment of the transfer structure may be generally similar to the first, second, or third embodiment of the transfer structure, except for the following difference (for the sake of brevity, only one supporting member 301 is illustrated below even though more than one supporting members 301 may be provided).

Figure 8:
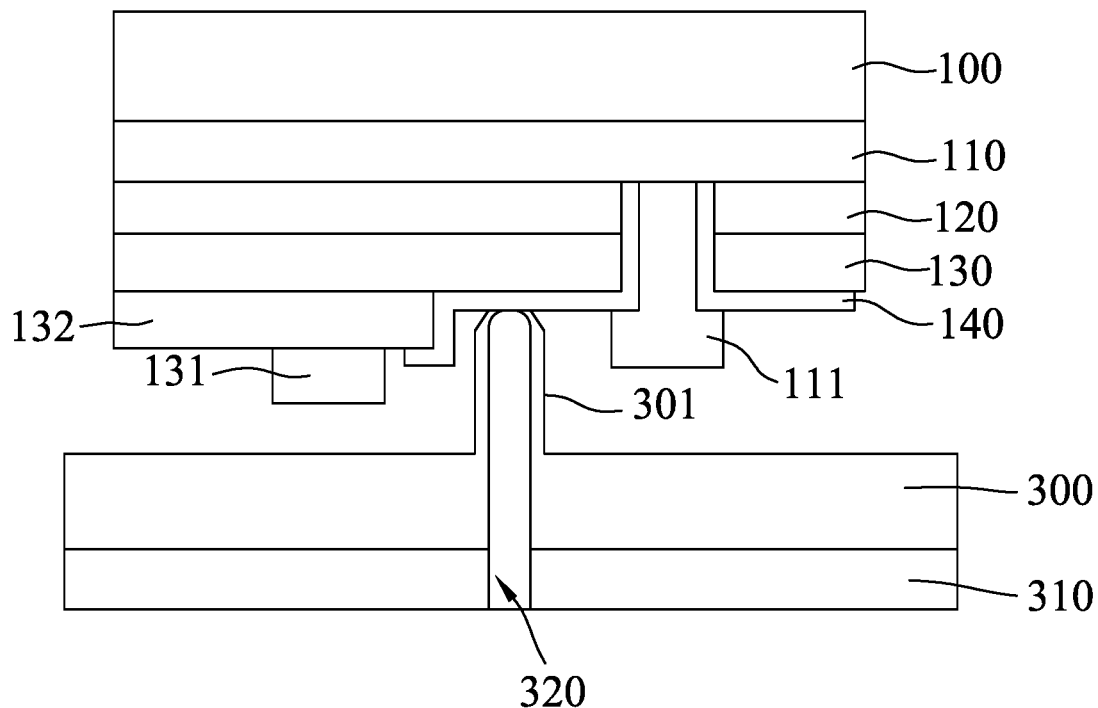
FIG. 8 is a schematic sectional view illustrating a fourth embodiment of the transfer method according to the present disclosure, as well as a fourth embodiment of a transfer structure according to the present disclosure.

Referring to FIG. 8, the supporting member 301 has a tapered width section that is bonded to the insulation layer 140 of the micro light-emitting element, and a larger width section that extends from the tapered width section to the bonding layer 300 and that is larger in width than the tapered width section. Specifically, the supporting member 301 has a first end that is bonded to the micro light-emitting element and that is a part of the tapered width section, and a second end that is opposite to the first end and connected to the bonding layer 300, that is larger in width than the first end, and that is a part of the larger width section. Since the tapered width section of the supporting member 301 in the fourth embodiment has a smaller contact area with the insulation layer 140 and hence weaker adhesion strength thereto compared to the supporting member 301 having a uniform width (for instance, see FIG. 5), the supporting member 301 in the fourth embodiment can be more easily separated from the insulation layer 140, such that the supporting member 301 can be further prevented from remaining and breakage during separation.

The first end of the supporting member 301 may have a width ranging from 1 µm to 6 µm.

Figure 9:
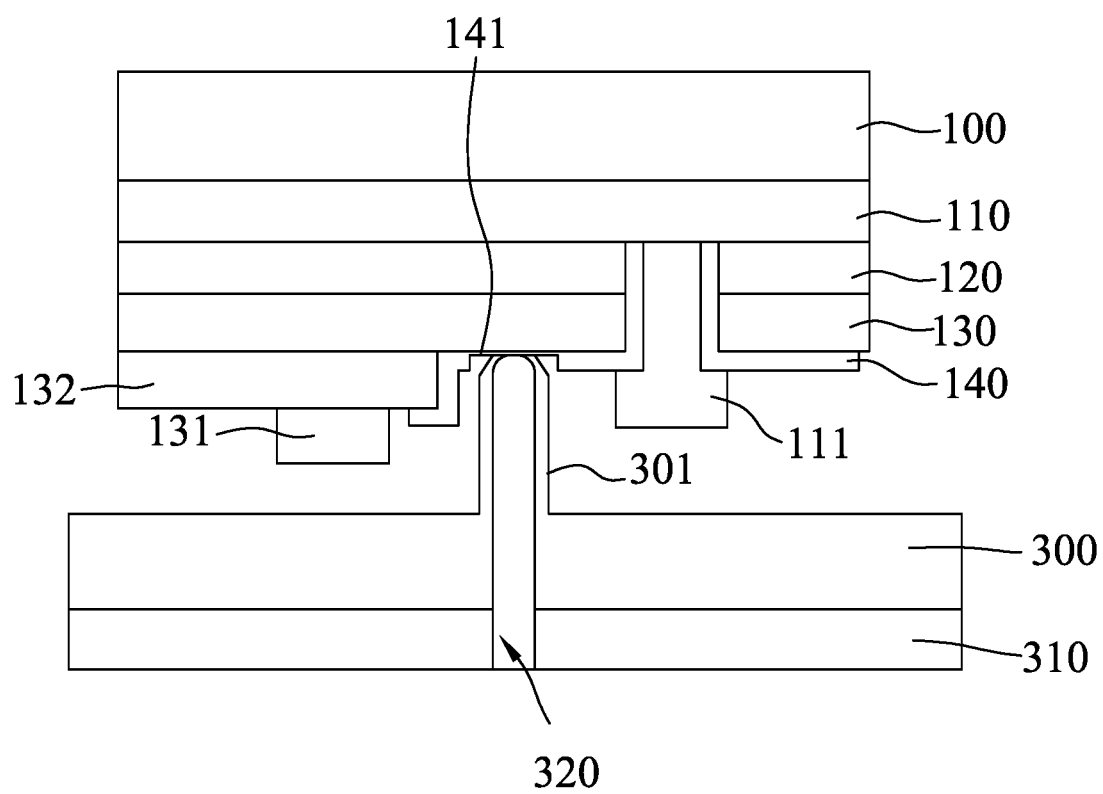
FIG. 9 is a schematic sectional view illustrating a variation of the fourth embodiment of the transfer method.

In a variation of the fourth embodiment, referring to FIG. 9, the insulation layer 140 of the micro light-emitting element has a recess 141 that is indented toward the second-type semiconductor layer 130 of the micro light-emitting element, and that the tapered width section (specifically, the first end) of the supporting member 301 is bonded thereto. Therefore, if the first end of the tapered width section of the supporting member 301 broke during separation of the insulation layer 140 from the supporting member 301, the residue of the first end of the tapered width section of the supporting member 301 could be retained in the recess 141, thus preventing adverse influence on the micro light-emitting element during subsequent processing of the micro light-emitting element.

With the transfer method and the transfer structure of the present disclosure, micro semiconductor elements (having, for instance, a size of less than 100 µm) can be transferred at a satisfactory success rate, since bonding of such elements to the transfer structure of the present disclosure is secure and separation of such elements from the transfer structure of the present disclosure is convenient.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for transferring a micro semiconductor element, comprising:
providing a substrate, a bonding layer that is disposed on the substrate, and a supporting member that is disposed on the bonding layer opposite to the substrate;
bonding the supporting member to the micro semiconductor element through a bonding process in the absence of a suction force, so that the supporting member supports the micro semiconductor element;
providing a through hole to extend through the substrate, the bonding layer, and the supporting member; and
applying a separation force via the through hole to separate the micro semiconductor element from the supporting member.

2. The method as claimed in claim 1, wherein a plurality of the supporting members are disposed on the bonding layer opposite to the substrate, and are respectively bonded to a plurality of the micro semiconductor elements, a plurality of the through holes extending through the substrate and the bonding layer, and respectively extending through the supporting members, the separation force being applied to separate at least one of the micro semiconductor elements from a corresponding one of the supporting members via a corresponding one of the through holes.

3. The method as claimed in claim 1, wherein the separation force is a pushing force, and is generated by delivering a fluid toward the micro semiconductor element via the through hole.

4. The method as claimed in claim 2, wherein a suction force is applied to at least one of remainder of the micro semiconductor elements via a corresponding one of the through holes.

5. The method as claimed in claim 1, wherein the through hole has a width ranging from 1 μm to 10 μm.

6. The method as claimed in claim 1, wherein the supporting member has a first end that is bonded to the micro semiconductor element, and a second end that is opposite to the first end and connected to the bonding layer and that is larger in width than the first end.

7. The method as claimed in claim 6, wherein the first end of the supporting member has a width ranging from 1 μm to 6 μm.

8. The method as claimed in claim 1, wherein the bonding layer and the supporting member are made from a polymer material.

9. The method as claimed in claim 1, wherein the bonding layer and the supporting member are made from a material selected from the group consisting of a benzocyclobutene-based polymer, silicone rubber, a polyester resin, polyurethane, polyimide, artificial rubber other than silicone rubber, an epoxy resin, polydimethylsiloxane, polyethylene terephthalate, poly(methyl methacrylate), multiwalled carbon nanotubes, and combinations thereof.

10. The method as claimed in claim 1, wherein the micro semiconductor element has a surface that faces the supporting member, and includes an insulation layer that is disposed on the surface, and that is bonded to the supporting member.

11. The method as claimed in claim 10, wherein the insulation layer of the micro semiconductor element has a recess that is indented toward the surface of the micro semiconductor element, and that the supporting member is bonded thereto.

* * * * *